United States Patent [19]

Helle et al.

[11] Patent Number: 4,484,157
[45] Date of Patent: Nov. 20, 1984

[54] VOLTAGE CONTROLLED CRYSTAL OSCILLATOR HAVING WIDE FREQUENCY RANGE

[75] Inventors: Jacques Helle; Gérard Charlet, both of Sartrouville, France

[73] Assignee: Compagnie d'Electronique et de Piezo-Electricite, Sartrouville, France

[21] Appl. No.: 353,102

[22] Filed: Mar. 1, 1982

[30] Foreign Application Priority Data

Mar. 3, 1981 [FR] France .................. 81 04198

[51] Int. Cl.³ .......................................... H03B 5/32
[52] U.S. Cl. ................. 331/116 R; 331/158; 331/177 V
[58] Field of Search .......... 331/36 C, 116 R, 116 FE, 331/158, 160, 177; 332/30 V

[56] References Cited

U.S. PATENT DOCUMENTS

| 3,302,138 | 1/1967 | Brown et al. | 331/177 V |
| 3,845,410 | 10/1974 | Steel | 331/116 R |
| 3,916,344 | 10/1975 | Enderby | 331/116 R |
| 3,958,190 | 5/1976 | Minch | 331/116 R |
| 4,063,194 | 12/1977 | Helle | 331/116 R X |
| 4,104,599 | 8/1978 | Tagawa | 331/177 V |
| 4,134,085 | 1/1979 | Driscoll et al. | 331/116 R |

FOREIGN PATENT DOCUMENTS

| 679074 | 1/1964 | Canada | 331/177 V |
| 2739057 | 3/1979 | Fed. Rep. of Germany . | |
| 2254148 | 7/1975 | France . | |
| 2276732 | 1/1976 | France . | |
| 2394203 | 1/1979 | France . | |
| 16523 | 8/1974 | Japan | 331/116 R |
| 125703 | 9/1980 | Japan | 331/116 R |

OTHER PUBLICATIONS

Otala, M. "Distortion and its Compensation in a Varactor-controlled Frequency Modulator" Proceedings of IEEE, v. 117, N. 2, pp. 338–342, Feb. 1970.

Primary Examiner—Eugene R. LaRoche
Assistant Examiner—W. R. Paxman
Attorney, Agent, or Firm—Oblon, Fisher Spivak, McClelland & Maier

[57] ABSTRACT

To extend the variation range of a controlled frequency oscillator comprising a piezoelectric element, a lithium tantalate or lithium niobate element is used in parallel with which there is connected a linearization circuit comprising an inductance in series with a parallel circuit comprising a resistor and a capacitor.

4 Claims, 3 Drawing Figures

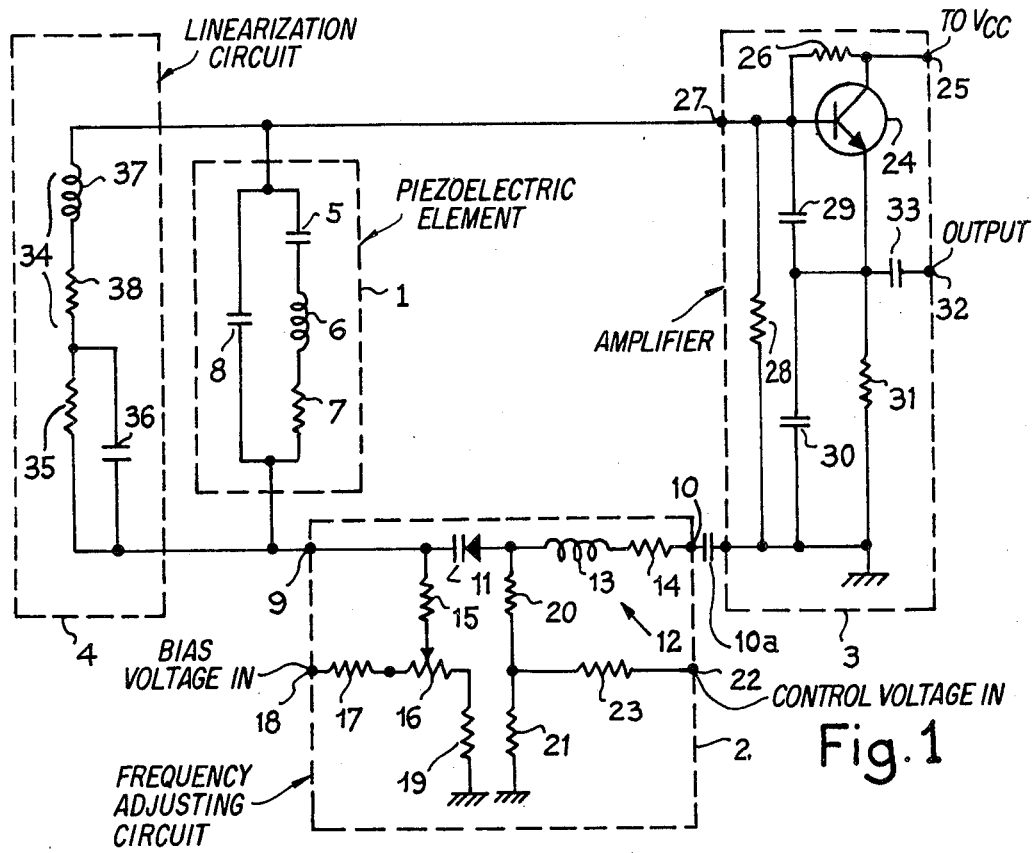
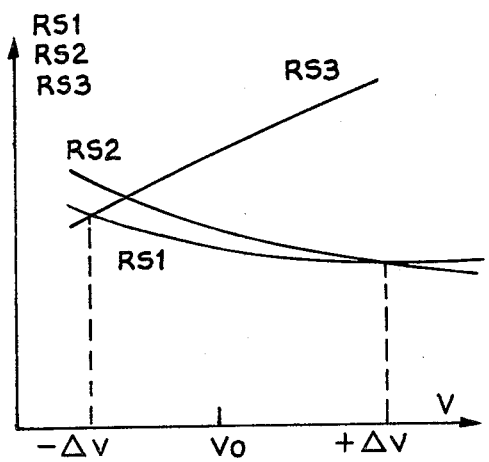
Fig.2
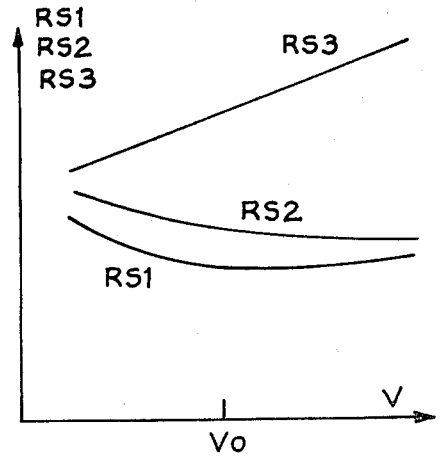
Fig.3

VOLTAGE CONTROLLED CRYSTAL OSCILLATOR HAVING WIDE FREQUENCY RANGE

BACKGROUND OF THE INVENTION

1. Field of the Invention

The present invention relates to a controlled frequency oscillator comprising a piezoelectric element and having an extensive range of frequency variation.

2. Description of the Prior Art

A controlled frequency oscillator may comprise, as the frequency defining element, either a circuit comprising inductances, resistors and capacitors, or a piezoelectric element. In the first case, the frequency variation range may be very extensive but the frequency stability is very poor. In the second case, when the piezoelectric element is a quartz, the frequency stability is very good but the frequency variation range is very restricted.

The present invention has as object a controlled frequency oscillator having both very good frequency stability and the most extensive frequency variation range possible.

SUMMARY OF THE INVENTION

The controlled frequency oscillator in accordance with the present invention comprises a piezoelectric element having a Q factor less than that of quartz, more especially a lithium tantalate or niobate element, a feedback linearization circuit being disposed in parallel across the piezoelectric element.

According to a preferred embodiment of the invention, said feedback linearization circuit comprises an inductance in series with a parallel circuit comprising a resistor and a capacitor.

BRIEF DESCRIPTION OF THE DRAWINGS

The present invention will be better understood from reading the detailed description of one embodiment, taken as a non-limiting example and illustrated by the accompanying drawings in which:

FIG. 1 is a diagram of said embodiment, and

FIGS. 2 and 3 are variation curves for parameters of some elements of the circuit of FIG. 1.

DESCRIPTION OF THE PREFERRED EMBODIMENT

The controlled frequency oscillator circuit shown in FIG. 1 of the drawings comprises essentially a piezoelectric element 1 disposed in series with a frequency adjusting circuit 2 in the feed-back loop of an amplifier 3, a linearization circuit 4 being disposed in parallel with the piezoelectric element 1.

In FIG. 1 of the drawings, the piezoelectric element 1 has been shown by its equivalent electric circuit. This equivalent electric circuit comprises a series circuit formed of a capacitor 5, an inductance 6 and a resistor 7, a capacitor 8 being connected in parallel across this series circuit. The piezoelectric element 1 is for example made from lithium tantalate or lithium niobate.

Frequency adjusting circuit 2 comprises, between a terminal 9 connected to the piezoelectric element 1 and a terminal 10 connected to the ground of amplifier 3 through a capacitor 10a, a series circuit comprising an element 11 with variable capacity as a function of the voltage, such as varactor, and an inductance 12. Inductance 12 is shown by its equivalent series circuit which comprises a purely inductive element 13 and a purely resistive element 14. The electrode of element 11 connected to terminal 9 is also connected through a resistor 15 to the slider of a potentiometer 16. One of the terminals of potentiometer 16 is connected through a resistor 17 to a terminal 18 itself connected to an appropriate biassing voltage source (not shown). The other terminal of potentiometer 16 is connected to ground through a resistor 19. The electrode of element 11 connected to inductance 12 is also connected to ground through two resistors 20 and 21 disposed in series. The common point between resistors 20 and 21 is connected to a terminal 22 through a resistor 23. Terminal 22 is connected to an appropriate control voltage source (not shown). This control voltage source may be any device, either manual or automatic, controlling the variation in the frequency of the oscillator circuit shown in the drawings while producing a corresponding voltage which causes the capacity of element 11 to vary. One at least of resistors 17 and 19 may be a thermistor for better compensating the thermal drift of the piezoelectric element 1 and its associated circuit. The circuit comprising elements 15 to 23 is one possible example of a circuit for controlling the capacity of element 11, but it will be readily understood that other control circuits performing the same function may be suitable.

Amplifier 3 shown in the drawings is a conventional amplifier of the "Clapp" type, but it will be understood that the invention is not limited to such an amplifier and that many other amplifiers may be suitable.

Amplifier 3 comprises a transistor 24, for example of the NPN type, whose collector is connected to a terminal 25 and to its base through a resistor 26. Terminal 25 is connected to an appropriate voltage supply source Vcc (not shown). The base of transistor 24 is also connected, on the one hand, to a terminal 27 and, on the other hand, to ground through a parallel circuit formed by a resistor 28 in parallel with a series circuit comprising two capacitors 29 and 30. The emitter of transistor 24 is connected, on the one hand, to the common point between capacitors 29 and 30 and, on the other hand, to ground through a resistor 31 and further to a terminal 32 through a capacitor 33. Terminal 32 forms the output terminal of amplifier 3 a which the output signal of the oscillator circuit shown i the drawings is available. Terminal 27 of amplifier 3 i connected to the common point between element 1 and thelinearization circuit 4.

The linearization circuit 4 comprises an inductance 34 in series with a parallel circuit comprising a resistor 35 in parallel with a capacitor 36. Inductance 34 has been shown by its equivalent series circuit which comprises a pure inductance 37 and a pure resistance 38.

The above-described oscillator circuit may oscillate at three different frequencies determined by the piezoelectric element 1 and the associated elements of circuits 2 and 4. Let us call these three frequencies FS1, FS2 and FS3. Frequency FS1, which is the useful frequency, is determined by elements 5, 6 of the piezo-electric element 1 and by elements 11, 13 and 14 of circuit 2. Frequency FS2 is determined by elements 8, 11, 13 and 14 and is higher than FS1. Frequency FS3 is determined by elements 35, 36, 37 and 38 of circuit 4 and elements 11, 13 and 14 of circuit 2 and is lower than FS1. Depending on the value of the above-mentioned elements and in particular on the value of element 11, the oscillator circuit oscillates at the frequency which corresponds to the minimum impedance or resistance. If we assume first of all that elements 35 and 36, essential elements of the invention, have a zero value and if we plot as a function of the voltage V applied to element 11, the variation curves of resistances RS1, RS2 and RS3 each corresponding to the resistive part of the series circuit determining the oscillation frequency FS1, FS2 and FS3 respectively, we obtain the diagram of FIG. 2. In this diagram of FIG. 2, the abscissa of the intersection point of the curves corresponding to RS1 and RS3 is referenced $-\Delta$ V and the abscissa of the point of intersection of the curves corresponding to RS1 and RS2 is referenced $+\Delta$ V. The middle of the segment between $-\Delta$ V and $+\Delta$ V is referenced Vo.

It can be seen in the diagram of FIG. 2 that, when the voltage applied to the terminals of element 11 is less than $-\Delta$ V, the minimum resistance is RS3, which means that the oscillating circuit then oscillates at frequency FS3. When the voltage applied to the terminals of element 11 is greater than $+\Delta$ V, the minimum resistance is RS2, which means that the oscillating circuit then oscillates at frequency FS2.

Since the useful frequency must be FS1, it can be seen that the range of variation of the voltage is between $-\Delta$ V and $+\Delta$ V, i.e. Vo$\pm\Delta$ V and that there is a risk of oscillation frequency change at the limits of this range which is relatively restricted. If Fo is the oscillation frequency corresponding to the voltage Vo applied to element 11, the oscillation frequency variation range corresponding to a variation of voltage V about Vo, within the limits $+\Delta$ V and $-\Delta$ V, i.e. without the risk of suddenly passing over to frequency FS2 or FS3, is about Fo$\pm 10^{-3}$Fo, which may be insufficient in some applications.

It can be seen that, by connecting in series with inductance 34 a parallel circuit formed of capacitor 36 and resistor 35 of appropriate values, the representative curves of the variations of RS1, RS2 and RS3 move apart from each other, as shown in FIG. 3.

With the diagram of FIG. 3 being plotted to the same scale as that of FIG. 2, it can be seen that in the case of FIG. 3 the representative curve of RS1 is situated substantially below the other two curves, in the range Vo$\pm\Delta$ V and even beyond. This means that the frequency variation range obtained by causing the voltage applied to the terminals of element 11 to vary is appreciably more extensive than in the case shown in FIG. 2. Thus, frequency variation ranges have been obtained of about Fo$\pm 10^{-2}$Fo, which is a considerable progress.

Since the calculation of the elements of circuit 4 is very complex, it is preferable to proceed by successive tests for determining the values of these different elements. Since the determination of the other elements of the oscillating circuit are well known per se, it will not be further described here.

Since the influence of the addition of the elements of circuit 4 on the other elements of the circuit of FIG. 1 is limited to the possible requirement of choosing an element 11 whose capacity variation is sufficient to cover the whole frequency variation range permitted by the circuit of the invention, a person skilled in the art may readily determine all the elements of the oscillator circuit.

The table given below indicates the values of the elements of circuit 4 for different nominal frequencies Fo, which values are practically optimum and determined experimentally. The value of resistance 38, which represents the ohmic resistance of inductance 37, is less critical than that of the other elements of circuit 4. This resistance value 38 may be, in the cases envisaged below, from a few ohms to a few tens of ohms for inductances formed in an appropriate conventional way. For other frequencies, values sufficiently close to the optimum value may be obtained by interpolation so as to readily find the optimum values after a reduced number of tests.

| Reference | 10 MHz | 18 MHz | 30 MHz |
|-----------|--------|--------|--------|
| 35 | 75Ω | 50Ω | 45Ω |
| 36 | 22 pF | 12 pF | 10 pF |
| 37 | 16 μH | 2.7 μH | 0.82 μH |

What is claimed is:
1. A voltage controlled crystal oscillator comprising:
a piezoelectric element having a Q factor less than that of quartz and including a crystal selected from the group consisting of lithium tantalate and lithium niobate;
a feedback linearization circuit connected in parallel with said piezoelectric element, said feedback linearization circuit comprising an inductance connected in series with a parallel circuit comprising a resistor and a capacitor;
a frequency adjusting circuit connected in series with the parallel combination of said piezoelectric element and said linearization circuit; and
an amplifier circuit having a feedback loop in which is connected the series combination of said frequency adjusting circuit connected in series with the parallel combination of said piezoelectric element and said linearization circuit, said amplifier circuit oscillating at a frequency corresponding to a minimum impedance defined by said series combination of said frequency adjusting circuit connected in series with the parallel combination of said piezoelectric element and said linearization circuit.

2. The voltage controlled crystal oscillator as claimed in claim 1, for operation at about 10 MHz, wherein, in said linearization circuit, the inductance, the resistor, and the capacitor have as respective values: about 16μH, 75Ω and 22 pF.

3. The voltage controlled crystal oscillator as claimed in claim 1, for operation at about 18 MHz, wherein, in said linearization circuit, the inductance, the resistor and the capacitor have as respective values: about 2.7μH, 50Ω, and 12 pF.

4. The voltage controlled crystal oscillator as claimed in claim 1, for operation at about 30 MHz, wherein, in said linearization circuit, the inductance, the resistor and the capacitor have as respective values: 0.82μH, 45Ω and 10 pF.

* * * * *